(12) United States Patent
Glicksman et al.

(10) Patent No.: US 6,762,009 B2
(45) Date of Patent: Jul. 13, 2004

(54) AQUEOUS DEVELOPABLE PHOTOIMAGEABLE THICK FILM COMPOSITIONS WITH PHOTOSPEED ENHANCER

(75) Inventors: Howard David Glicksman, Durham, NC (US); Haixin Yang, Chapel Hill, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 117 days.

(21) Appl. No.: 10/256,348

(22) Filed: Sep. 27, 2002

(65) Prior Publication Data

US 2003/0138708 A1 Jul. 24, 2003

Related U.S. Application Data

(60) Provisional application No. 60/328,733, filed on Oct. 12, 2001.

(51) Int. Cl.[7] ........................ G03C 1/725; G03C 1/73; G03C 1/74; G03F 7/038; G03F 7/027
(52) U.S. Cl. ............................. 430/287.1; 430/270.1; 430/281.1; 430/285.1; 430/910; 430/916; 430/330; 522/79; 522/80; 522/81; 522/83; 522/153
(58) Field of Search ........................ 522/79, 80, 81, 522/83, 153; 430/287.1, 270.1, 281.1, 285.1, 910, 916, 330

(56) References Cited

U.S. PATENT DOCUMENTS

| | | | |
|---|---|---|---|
| 4,912,019 A | 3/1990 | Nebe et al. | |
| 4,925,771 A | 5/1990 | Nebe et al. | |
| 5,049,480 A | 9/1991 | Nebe et al. | |
| 5,080,999 A | 1/1992 | Imai et al. | |
| 5,134,175 A | 7/1992 | Lucey | |
| 5,180,757 A | 1/1993 | Lucey | |
| 5,972,564 A | 10/1999 | Kawana et al. | |
| 6,004,705 A | 12/1999 | Masaki et al. | |
| 6,103,452 A | 8/2000 | Kakinuma et al. | |
| 6,194,124 B1 | 2/2001 | Choi et al. | |
| 6,312,864 B1 | 11/2001 | Tokai et al. | |
| 6,315,927 B1 | 11/2001 | Kubota et al. | |
| 6,326,125 B1 | 12/2001 | Kakinuma et al. | |
| 6,342,322 B1 | 1/2002 | Kakinuma et al. | |

FOREIGN PATENT DOCUMENTS

| | | |
|---|---|---|
| EP | 0 414 167 | 2/1991 |
| JP | 567405 | 3/1993 |
| JP | 5271576 | 10/1993 |
| JP | 3218767 | 10/2001 |

*Primary Examiner*—Mark F. Huff
*Assistant Examiner*—Sin J. Lee

(57) ABSTRACT

A photoimageable composition comprising finely divided particles of inorganic materials comprising functional phase particles selective from electrically conductive, resistive and dielectric particles; and inorganic binder dispersed in organic medium comprising an aqueous developable polymer; photoinitiation system; and a photospeed enhancer wherein the enhancer comprises a ratio of 30/70 to 70/30 mixture selected from stearic acid and palmitic acid; salt of stearate and salt of palmitate; stearic acid and salt of palmitate; salt of stearate and palmitic acid; and organic solvent.

12 Claims, No Drawings

AQUEOUS DEVELOPABLE PHOTOIMAGEABLE THICK FILM COMPOSITIONS WITH PHOTOSPEED ENHANCER

FIELD OF THE INVENTION

The invention is directed to a photoimageable thick film composition for use in photo-patterning methods, and more particularly, to a composition utilizing a photospeed enhancer.

BACKGROUND OF THE INVENTION

Since it is the trend in the industry to make smaller and cheaper electronic devices and provide higher resolution for performance, it has become necessary to develop new photoimageable materials to manufacture such devices. Photo-patterning technologies offer uniform finer lines and space resolution when compared to traditional screen-printing methods. A photo-patterning method, such as DuPont's FODEL® printing system, utilizes a photoimageable organic medium as found in patents U.S. Pat. Nos. 4,912,019; 4,925,771; and 5,049,480, whereby the substrate is first completely covered (printed, sprayed, coated or laminated) with the photoimageable thick film composition and dried. An image of the circuit pattern is generated by exposure of the photoimageable thick film composition with actinic radiation through a photomask bearing a circuit pattern. The exposed substrate is then developed. The unexposed portion of the circuit pattern is washed away leaving the photoimaged thick film composition on the substrate that, subsequently, is fired to remove all remaining organic materials and sinter inorganic materials. Such a photo-patterning method demonstrates line resolution of about 30 microns depending on the substrate smoothness, inorganic particle size distribution, exposure and development variables.

Despite the foregoing advances in such systems, manufacturers are continuously seeking compositions with improved photospeed and finer resolution of lines and spaces. Such materials will increase the speed of the manufacturing processes without compromising high resolutions in the lines and spaces of the circuit pattern. The present invention is directed to such a composition.

SUMMARY OF THE INVENTION

The invention is directed to a photoimageable composition comprising functional phase particles; finely divided particles of an inorganic binder having a glass transition temperature in the range of 325 to 600° C. a surface area to weight ratio of no greater than 10 m²/g and at least 85 wt. % of the particles having a size of 0.1–10 µm; aqueous developable photocrosslinkable polymer which is the copolymer, interpolymer or mixture thereof, wherein each copolymer or interpolymer comprises (1) nonacidic comonomers comprising $C_{1-10}$ alkyl methacrylate, $C_{1-10}$ alkyl acrylates, styrene, substituted styrene, or combinations thereof and (2) an acidic comonomer comprising ethylenically unsaturated carboxylic acid containing moiety, wherein 2–20% of the carboxylic acid containing moiety is reacted with a reactive molecule having a first and second functional unit wherein the first functional unit is a vinyl group and the second functional unit is capable of forming a chemical bond by reaction with the carboxylic acid moiety forming the copolymer, interpolymer or mixture having an acid content of at least 10 wt. % of the total polymer weight; and having a glass transition temperature in the range of 50–150° C. and a weight average molecular weight in the range of 2,000–250,000; photoinitiation system; and photospeed enhancer wherein the enhancer comprises a ratio in the range of 30/70 to 70/30 mixture selected from stearic acid and palmitic acid; salt of stearate and salt of palmitate; stearic acid and salt of palmitate; salt of stearate and palmitic acid.

The invention is further directed to a photoimageable composition comprising functional phase particles; inorganic binder having a glass transition temperature in the range of 325 to 600° C. a surface area to weight ratio of no greater than 10 m²/g and at least 85 wt. % of the particles having a size of; 0.1–10 micrometers; organic polymeric binder which is a copolymer, interpolymer or mixture thereof, wherein each copolymer or interpolymer comprises (1) nonacidic comonomers comprising $C_{1-10}$ alkyl methacrylate, $C_{1-10}$ alkyl acrylates, styrene, substituted styrenes, or combinations thereof, and (2) an acidic comonomer comprising ethylenically unsaturated carboxylic acid containing moiety, the copolymer, interpolymer or mixture having an acid content of at least 10 wt. % of the total polymer weight; and having a glass transition temperature of 50–150° C. and a weight average molecular weight in the range of 2,000–250,000; photohardenable monomer; photoinitiation system; photohardenable monomer; photoinitiation system; and photospeed enhancer wherein the enhancer comprises 30/70 to 70/30 mixture selected from stearic acid and palmitic acid; salt of stearate and salt of palmitate; stearic acid and salt of palmitate; salt of stearate and palmitic acid.

DETAILED DESCRIPTION

The photosensitive thick film compositions of the present invention have functional phase particles which impart conductive, resistive or dielectric properties to the composition. An organic medium along with other components of the photosensitive compositions comprises polymers that may or may not be photosensitive in themselves. Components of the composition are described herein below.

I. Inorganic Materials

A. Functional Phase

In conductor applications the functional phase is comprised of electrically functional conductor powder(s). The electrically functional powders in a given thick film composition may comprise a single type of powder, mixtures of powders, alloys or compounds of several elements. Examples of such powders include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions.

In resistor compositions, the functional phase is generally a conductive oxide. Examples of the functional phase in resistor compositions are Pd/Ag and $RuO_2$. Other examples include ruthenium pyrochlore oxide which is a multi-component compound of $RU^{+4}$, $IR^{+4}$ or a mixture of these (M"), said compound being expressed by the following general formula:

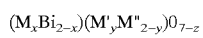

wherein
M is selected from the group consisting of yttrium, thallium, indium, cadmium, lead, copper and rare earth metals, M' is selected from the group consisting of platinum, titanium, chromium, rhodium and antimony, M" is ruthenium, iridium or a mixture thereof, x denotes 0 to 2 with a proviso that $x \leq 1$ for monovalent copper, y denotes 0 to 0.5 with the proviso that when M' is rhodium or two or more of platinum, titanium, chromium, rhodium and antimony, y stands for 0 to 1, and z denotes 0 to 1 with a proviso that when M is divalent lead or cadmium, z is at least equal to about x/2.

These ruthenium pyrochlore oxides are described in detail in the specification of U.S. Pat. No. 3,583,931. The preferred ruthenium pyrochlore oxides are bismuth ruthenate ($Bi_2Ru_2O_7$) and lead ruthenate ($Pb_2Ru_2O_6$).

In dielectric compositions, the functional phase is generally a glass or ceramic. Dielectric thick film compositions are nonconducting compositions or insulator compositions that separate electrical charges and may result in the storage of an electrical charge. Therefore, the thick film dielectric compositions typically contain ceramic powders, oxide and non-oxide frits, crystallization initiator or inhibitor, surfactants, colorants, organic mediums, and other components common in the art of such thick film dielectric compositions. Examples of ceramic solids include: alumina, titanates, zirconates and stannates, $BaTiO_3$, $CaTiO_3$, $SrTiO_3$, $PbTiO_3$, $CaZrO_3$, $BaZrO_3$, $CaSnO_3$, $BaSnO_3$ and $Al2O_3$, glass and glass-ceramic. It is also applicable to precursors of such materials, i.e., solid materials which upon firing are converted to dielectric solids, and to mixtures thereof.

B. Inorganic Binder

The electrically functional powders described herein above are finely dispersed in an organic medium and are accompanied by inorganic binders and are optionally accompanied by metal oxides, ceramics, and fillers, such as other powders or solids. The function of an inorganic binder in a composition is binding the particles to one another and to the substrate after firing. Examples of inorganic binders include glass binders (frits), metal oxides and ceramics. Glass binders useful in the composition are conventional in the art. Some examples include borosilicate and aluminosilicate glasses. Examples further include combinations of oxides, such as; $B_2O_3$, $SiO_2$, $Al_2O_3$, CdO, CaO, BaO, ZnO, $SiO_2$, $Na_2O$, $Li_2O$, PbO, and ZrO which may be used independently or in combination to form glass binders. Typical metal oxides useful in thick film compositions are conventional in the art and can be, for example, ZnO, MgO, CoO, NiO, FeO, MnO and mixtures thereof.

The glass frits most preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification may be used as well.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. The glass transition temperature is in the range of 325 to 600° C.

It is preferred that at least 85% the inorganic binder particles be in the range of 0.1–10 μm. The reason for this is that smaller particles having a high surface area tend to adsorb the organic materials and thus impede clean decomposition. On the other hand, larger size particles tend to have poorer sintering characteristics. It is preferred that the weight ratio of inorganic binder to total solids be in the range 0.1 to 2 and more preferably in the range 0.1 to 0.75 and all ranges contained therein.

II. Organic Medium

The main purpose of the organic medium is to serve as a vehicle for dispersion of the finely divided solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion. The main components of the medium follow:

A. Polymer

The polymer binder is important to the compositions of this invention. They have aqueous-developability and give a high resolving power. It was found that these requirements were satisfied by selecting the following binders. There are two general polymer binder descriptions utilized in various embodiments of this invention. They are commercially available polymers. They may be used independently or together in the formulations. First are binders made of copolymer, interpolymer or mixtures thereof made from (1) nonacidic comonomer comprising $C_{1-10}$ alkyl methacrylate, $C_{1-10}$ alkyl acrylates) nonacidic comonomers comprising $C_{1-10}$ alkyl methacrylate, $C_{1-10}$ alkyl acrylates, styrene, substituted styrene, or combinations thereof and (2) acidic comonomer comprising ethylenically unsaturated carboxylic acid containing moiety; the copolymer, interpolymer or mixture thereof having an acid content of at least 10 wt. % of the total polymer weight; and having an average glass transition temperature (Tg) of 50–150° C. and weight average molecular weight in the range of 2,000–250,000 and all ranges contained therein.

Second are photocrosslinkable polymer binders. They are made of copolymer, interpolymer or mixtures thereof, wherein each copolymer or interpolymer comprises (1) a nonacidic comonomer comprising a $C_{1-10}$ alkyl acrylate, $C_{1-10}$ alkyl methacrylate, styrene, substituted styrene or combinations thereof and (2) an acidic comonomer comprising ethylenically unsaturated carboxylic acid containing moiety, wherein 2–20% of the carboxylic acid containing moiety is reacted with a reactive molecule having a first and second functional unit, wherein the first functional unit is a vinyl group and the second functional unit is capable of forming a chemical bond by reaction with the carboxylic acid moiety. Examples of the vinyl group include, but are not limited to methacrylate and acrylate groups. Examples of the second functional unit include, but are not limited to epoxides, alcohols and amines. The resultant copolymer, interpolymer or mixture thereof has an acid content of at least 10 wt. % of the total polymer weight; a glass transition temperature of 50–150° C. and an weight average molecular weight in the range of 2,000–250,000 and all ranges contained within.

The presence of acidic comonomer components in the composition is important in this technique. The acidic functional group generates the ability to be developed in aqueous bases such as aqueous solutions of 0.4–2.0% sodium carbonate. When acidic comonomers are present in concentrations of less than 10%, the composition is not washed off completely with an aqueous base. When the acidic comonomers are present at concentrations greater than 30%, the composition is less resistant under development conditions and partial development occurs in the image portions. Appropriate acidic comonomers include ethylenically unsaturated monocarboxylic acids such as acrylic acid, methacrylic acid, or crotonic acid and ethylenically unsaturated dicarboxylic acids such as fumaric acid, itaconic acid, citraconic acid, vinyl succinic acid, and maleic acid, as well as their hemiesters, and in some cases their anhydrides and their mixtures. Because they are cleaner burning in low-oxygen atmospheres, methacrylic polymers are preferred over acrylic polymers.

When the nonacidic comonomers are alkyl acrylates or alkyl methacrylates as mentioned above, it is preferable that these nonacidic comonomers constitute at least 50 wt. %, preferably 70–75 wt. %, of the polymer binder. When the nonacidic comonomers are styrene or substituted sytrenes, it is preferable that these nonacidic comonomers constitute 50 wt. % of the polymer binder and that the other 50 wt. % is an acid anhydride such as the hemiester of maleic anhydride. A favorable substituted styrene is alpha-methylstyrene.

Although not preferable, the nonacidic portion of the polymer binder can contain up to about 50 wt. % of other nonacidic comonomers as substitutes for the alkyl acrylate, alkyl methacrylate, styrene, or substituted styrene portions of the polymer. Examples include: acrylonitrile, vinyl acetate, acrylamide. However, because it is more difficult for these to completely burn out, it is preferable that less than about 25 wt. % of such monomers in the total polymer binder is used. The use of single copolymers or combinations of copolymers as binders are recognized as long as each of these satisfy the various standards above. In addition to the above copolymers, adding small amounts of other polymer binders is possible. Some examples include polyolefins such as polyethylene, polypropylene, polybutylene, polyisobutylene, and ethylene-propylene copolymers, polyvinyl alcohol polymers (PVA), polyvinyl pyrrolidone polymers (PVP), vinyl alcohol and vinyl pyrrolidone copolymers, as well as polyethers that are low alkylene oxide polymers such as polyethylene oxide can be cited.

In the second polymer binder described above, the acidic comonomer provides the polymer with a reactive molecule to introduce functional units such as photocrosslinkable functional units. This is accomplished by utilizing 2–20% of the carboxylic acid containing moiety reacting with the reactive molecule that contains a vinyl group, as shown in the schematic below. The final polymer has three repeating units, as shown. These polymers are well known to those skilled in the art.

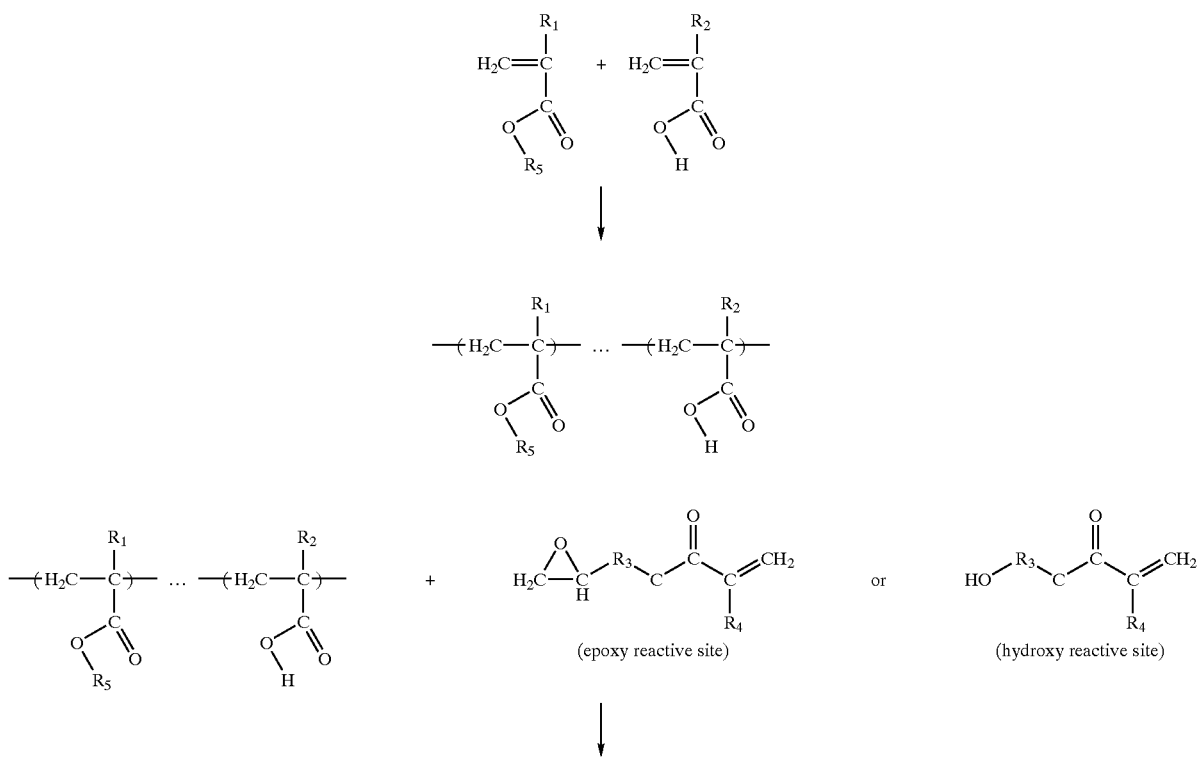

-continued

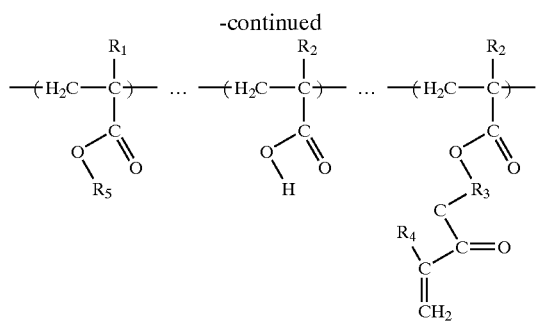

Where:
- $R_1$, $R_2$ and $R_4$ are methyl group or hydrogen or a mixture thereof; and
- $R_3$ is a straight, branched or ring alkyl group which may contain aromatic groups or other atoms, for example, oxygen; and
- $R_5$ is an alkyl ($C_1$–$C_{10}$).

The polymers described herein can be produced by those skilled in the art of acrylate polymerization by commonly used solution polymerization techniques. Typically, such acidic acrylate polymers are produced by mixing α- or β-ethylenically unsaturated acids (acidic comonomers) with one or more copolymerizable vinyl monomer (nonacidic comonomers) in a relatively low boiling point (75–150° C.) organic solvent to obtain a 10–60% monomer mixture solution, then polymerizing the monomers by adding a polymerization catalyst and heating the mixture under normal pressure to the reflux temperature of the solvent. After the polymerization reaction is essentially complete, the acidic polymer solution produced is cooled to room temperature. To obtain the first kind of polymer binder (one without photosensitivity), the process is stopped at this step. Samples are collected, and the polymer viscosity, molecular weight, and acid equivalents are measured.

To obtain the photocrosslinkable polymer binder, a reactive molecule, a free radical polymerization inhibitor and a catalyst are added to the cooled polymer solution described above. The solution is stirred until the reaction is complete. Optionally, the solution may be heated to speed up the reaction. After the reaction is complete and the reactive molecules are chemically attached to the polymer backbone, the polymer solution is cooled to room temperature, samples are collected, and the polymer viscosity, molecular weight, and acid equivalents are measured.

Furthermore, the weight average molecular weight of the polymer binder is in the range of 2,000–250,000 and any ranges contained therein. The molecular weight of the polymer binder will depend on the application. Weights less than 10,000 are generally useful in paste compositions and above 10,000 are generally useful in tapes or sheets. Polymers with molecular weight less than 10,000 generally have lower film forming ability. They may be used in tape formulations but generally require mixing with other compatible high molecular weight polymers to form a tape or film.

When the above composition is coated to form a dry film, it is preferable that the Tg (glass transition temperature) of the polymer binder is 50–150° C., and more preferably 50–100° C. The polymer is found in the composition in the range of 5–70 wt. % and any ranges contained therein based on total composition.

B. Photohardenable Monomer

Conventional photohardenable methacrylate monomers may be used in the invention. Depending on the application, it is not always necessary to include a monomer in the composition of the invention when using the photocrosslinkable polymer. Monomer components are present in amounts of 1–20 wt. %, based on the total weight of the dry photopolymerizable layer. Such preferred monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethyacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl)ether of bisphenol-A, di-(2-acryloxyethyl) ether of bisphenol-A, di-(3-methacrloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a weight average molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of free radical polymerizable ethylenic linkages particularly when present as terminal linkages. Particularly preferred monomers are polyoxyethylated trimethylolpropane triacrylate, ethylated pentaerythritol triacrylate, dipentaerythritol monohydroxypentaacrylate and 1,10-decanediol dimethlacrylate.

C. Photoinitiation System

Suitable photoinitiation systems are those, which generate free radicals upon exposure to actinic light at ambient temperature. These include the substituted or unsubstituted polynuclear quinones which are compounds having two intracyclic carbon atoms in a conjugated carbocyclic ring system, e.g., 2-benzyl-2-(dimethylamino)-1-(4-morpholinophenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz (a) anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthracene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin, thioxanthone and/or thioxanthone derivatives and the appropriate hydrogen donors. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in the range of 0.05 to 10% by weight based on the total weight of a dry photopolymerizable layer.

D. Organic Solvent

The solvent component of the organic medium, which may be a mixture of solvents, is chosen so as to obtain complete solution therein of the polymer and other organic components. The solvent should be inert (non-reactive) towards the other components of the composition. For screen printable and photoimageable pastes, the solvent(s) should have sufficiently high volatility to enable the solvent to be evaporated from the dispersion by the application of relatively low levels of heat at atmospheric pressure, however, the solvent should not be so volatile that the paste rapidly dries on a screen, at normal room temperatures, during the printing process. The preferred solvents for use in the paste compositions should have boiling points at atmospheric pressure of less than 300° C. and preferably less than 250° C. Such solvents include aliphatic alcohols, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as TEXANOL® (2,2,4-trimethyl-1,3-pentanediol monoisobutyrate). For casting tapes, the solvent(s) have lower boiling points than solvents used for screen printable pastes. Such solvents include ethylacetate, methanol, isoproanol, acetone, xylene, ethanol, methylethyl ketone and toluene.

E. Other Additives

Frequently the organic medium will also contain one or more plasticizers if additional film softness is needed. Such plasticizers help to assure good lamination to substrates and enhance the developability of unexposed areas of the composition. However, the use of such materials should be minimized in order to reduce the amount of organic materials that must be removed when the films cast therefrom our fired. The choice of plasticizers is determined primarily by the polymer that must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly (ethylene oxides), hydroxy ethylated alkyl phenol, tricresyl phosphate triethyleneglycol diacetate and polyester plasticizers. Additional components known to those skilled in the art may be present in the composition including dispersants, stabilizers, release agents, dispersing agents, stripping agents, and antifoaming agents. A general disclosure of suitable materials is presented in U.S. Pat. No. 5,049,480.

F. Photospeed Enhancer

A photospeed enhancer is added to the organic medium or directly added to the composition. The photospeed enhancer is selected from the following: stearic acid, palmitic acid, a salt of stearate, a salt of palmitate wherein the counter-ion can be selected from, but is not limited to, hydrogen, ammonium, sodium and potassium or mixtures thereof. The mixture is usually found within the ratio of 30/70 to 70/30 and all ratios contained within. Examples of such mixtures include: stearic acid and palmitic acid; salt of stearate and salt of palmitate; stearic acid and salt of palmitate; salt of stearate and palmitic acid. The enhancer is found in the composition within the range of 0.10–1 wt % and all ranges contained within based on the weight of the functional phase.

General Paste Preparation

Typically, thick film compositions are formulated to have a paste-like consistency, and are called "pastes". Generally, the pastes are prepared under yellow light by mixing the organic vehicle, monomer(s), and other organic components in a mixing vessel. The inorganic materials are then added to the mixture of organic components. The total composition is then mixed until the inorganic powders are wetted by the organic materials. The mixture is then roll milled using a three roll mill. The paste viscosity at this point could be adjusted with the appropriate vehicle or solvent to achieve a viscosity optimum for processing.

Care is taken to avoid dirt contamination in the process of preparing paste compositions and in preparing parts, since such contamination can lead to defects.

General Firing Profile

The composition of the present invention may be processed by using a firing profile. Firing profiles are well within the knowledge of those skilled in the art of thick film technology. Removal of the organic medium and sintering of the inorganic materials is dependent on the firing profile. The profile will determine if the medium is substantially removed from the finished article and if the inorganic materials are substantially sintered in the finished article. The term "substantially" as used herein means at least 95% removal of the medium and sintering the inorganic materials to a point to provide at least adequate resistivity or conductivity or dielectric properties for the intended use or application.

General Tape Preparation

The composition of the present invention may be used in the form of a tape. If the composition is to be used in the form of a tape, a slip is prepared and used for tape casting. Slip is a general term used for the composition in tape making and is a properly dispersed mixture of inorganic powders dispersed in an organic medium. A common way of achieving a good dispersion of inorganic powders in the organic medium is by using a conventional ball-milling process. A ball milling consists of ceramic milling jar and milling media (spherical or cylindrical shaped alumina or zirconia pellets). The total mixture is put into the milling jar and the milling media are added. After closing the jar with a leak-tight lid, it is tumbled to create a milling action of the milling media inside the jar at a rolling speed at which the mixing efficiency is optimized. The length of the rolling is the time required to attain well dispersed inorganic particles to meet the performance specifications. The slip may be applied to a substrate by a blade or bar coating method, followed by ambient or heat drying. The coating thickness after drying may range from a few microns to several tens of microns depending on the application.

The tape may be laminated with a coversheet before it is wound as a widestock roll. Silicone coated terephthalate PET film, polypropylene, or polyethylene may be used as a coversheet. The coversheet is removed before laminated to the final substrate.

The present invention will be described in further detail by giving practical examples. The scope of the present invention, however, is not limited in any way by these practical examples.

TEST PROCEDURE USED IN EXAMPLES

The procedures used in testing the compositions for Examples 1–8 are found below.

Photospeed Step Wedge

The photospeed is determined by a photospeed step wedge. A Riston® 25-Step Density Tablet is used to measure results. The Tablet is available from The DuPont Company.

The Riston® 25-step Density Tablet (step tablet) is a strip of MYLAR® polyester film containing 25 numbered blocks (steps) of increasing optical density. It is used to measure the degree of polymerization of DuPont Riston® photopolymer films from exposure to ultraviolet (UV) light in the imaging step of printed wiring board manufacture.

Step tablets are made so that each step increases in optical density by a specific amount. As the step number increases, the amount of UV light passing through each step decreases. At a given exposure energy there will be a step where not enough light passes through the step tablet to polymerize a photoimageable paste sample. Therefore, the step tablet is used as a measure of the total amount of light that a photoimageable paste sample receives during exposure.

The wedge step number recorded is the highest number step that is more than 50% covered with the composition being tested.

EXAMPLES

The procedures for preparing the compositions for Examples 1–8 are found below.

A. Preparation of Medium

The solvent and acrylic polymer were mixed and heated with stirring to 80° C. Heating and stirring was continued until all binder polymer had dissolved. The solution was then cooled to 70° C. and the remaining organic components, including the photospeed enhancer where applicable, were added. This mixture was then stirred at 70° C. until all the solids had dissolved. The solution was passed through a 325 mesh filter screen, if needed, and allowed to cool.

B. Preparation of Glass Frit

The glass frit was used as available, or if necessary was prepared by water milling in a Sweco Mill using 0.5 in diameter by 0.5 in long alumina cylinders. The glass frit mixture was then either freeze dried or hot air dried. Hot air drying was normally done at a temperature of 150° C.

C. Paste Formulation

The pastes were prepared under yellow light by mixing the organic medium, monomer or monomers, and other organic components including the photospeed enhancer, where appropriate, in a mixing vessel. The inorganic materials were then added to the mixture of organic components. The total composition was then mixed until the inorganic powders were wetted by the organic materials. The mixture was then either roll milled using a three-roll mill or mulled on a Hoover Automatic Muller, Model M5. The pastes were then either used directly, or screened through a 635 mesh screen. The paste viscosity at this point could be adjusted with the appropriate medium or solvent to achieve a viscosity optimum for processing. The formulations for the composition are shown in Table 1.

D. Silver Preparation

Preparation of Silver Powder

A silver alkanolamine complex solution was prepared by first dissolving 105.4 g of silver nitrate in 1000 ml of de-ionized water. While stirring, 88 ml of monoethanolamine was added to form the soluble silver alkanolamine complex. The reducing solution was prepared by dissolving 17 g of hydroquinone into 600 ml of de-ionized water. While stirring, 700 ml of monoethanolamine was added. After 1 hour, the silver alkanolamine complex solution was added to the reducing solution in less than 5 seconds. After two minutes, the reaction mixture was heated to 70° C. The resulting silver powder was washed with de-ionized water until the conductivity was less than 10 micromhos in the wash water. The powder was then collected and freeze dried.

E. Process Conditions

Care was taken to avoid dirt contamination in the process of preparing paste compositions and in preparing parts, since such contamination can lead to defects. The paste was applied to glass substrates by screen-printing using 325 mesh screens. The parts were dried at ~80° C. in an air atmosphere oven. The dried coating thickness was measured at about 10 microns.

The parts were then exposed with a collimated UV exposure source through a phototool in contact with the sample surface. The exposed parts were developed using a conveyorized spray processor containing 0.5% by weight sodium carbonate in water as the developer solution. The developer temperature was maintained at ~30° C., and the developer solution was sprayed at 10–20 psi. The optimum exposure time and development rate was determined by preparing a matrix of parts with a range of exposure times and development rates for each composition. Microscopic examination of the parts after development yielded information on the best exposure time and development rate to reproducibly obtain the minimum line width or via diameter for each composition. The developed parts were dried by blowing off the excess water, after development, with a forced air stream. The dried parts were then normally fired in an air atmosphere at peak temperatures of 520° C.

Explanation of Tables

Table 1 gives formulations for Examples 1 through 8. Table 2 shows the results of testing the formulations.

Examples 1–5 are used to show the effect of adding stearic acid, palmitic acid or mixtures of stearic acid and palmitic acid directly into the paste. Examples 1 and 2 show that pure palmitic acid or pure stearic acid did not increase the photospeed. Examples 3–6 show that the 50/50 by weight mixture of stearic acid and palmitic acid give the best improvement in photospeed.

Example 6 has the 50/50 by weight mixture of stearic acid and palmitic acid added into the medium. This example had a similar effect on photospeed as Example 3.

Example 7 has the UV-imageable polymer showing that the photospeed enhancer works well with UV-imageable polymer.

Example 8 is a comparative example without the photospeed enhancer.

Table 2 shows results to various testing as described herein above.

All values given in the tables are in weight % based on total composition.

TABLE 1

| Examples | 1 | 2 | 3 | 4 | 5 | 6 | 7 | 8 |
|---|---|---|---|---|---|---|---|---|
| Formula | | | | | | | | |
| Stearic acid (C-18) | 0.34 | | | | | | | |
| Palmitic acid (C-16) | | 0.34 | | | | | | |
| Stearic acid/Palmitic acid 50/50 by weight | | | 0.34 | | | | | |
| Stearic acid/Palmitic acid 70/30 by weight | | | | 0.34 | | | 0.34 | |
| Stearic acid/Palmitic acid 30/70 by weight | | | | | 0.34 | | | |
| Medium I | 20.4 | 20.4 | 20.4 | 20.4 | 20.4 | | 20.4 | 20.4 |
| Medium II | 1.94 | 1.94 | 1.94 | 1.94 | 1.94 | 1.94 | | 1.94 |
| Medium III | | | | | | 20.4 | | |
| Medium IV | | | | | | | 1.94 | |
| Silver Powder | 68.6 | 68.6 | 68.6 | 68.6 | 68.6 | 68.6 | 68.6 | 68.6 |
| Glass Frit | 1.94 | 1.94 | 1.94 | 1.94 | 1.94 | 1.94 | 1.94 | 1.94 |
| Malonic acid | 0.15 | 0.15 | 0.15 | 0.15 | 0.15 | 0.15 | | 0.15 |
| Texanol | 2.91 | 2.91 | 2.91 | 2.91 | 2.91 | 2.91 | | 2.91 |
| Monomer | 3.72 | 3.72 | 3.72 | 3.72 | 3.72 | 3.72 | 3.72 | 3.72 |

TABLE 2

| Example | 1 | 2 | 3 | 4 | 5 | 6 | 7 | 8 |
|---|---|---|---|---|---|---|---|---|
| Photospeed step wedge | 2 | 3 | 17 | 15 | 14 | 17 | 20 | 0 |

GLOSSARY FOR EXAMPLES

I. Glass Frit

The glass frit is composed of the component weight % of the following: $SiO_2$ (9.1), $Al_2O_3$ (1.4), PbO (77.0), $B_2O_3$ (12.5).

II. Polymers

Polymer I: PVP/VA S-630, a copolymer of 60% vinylpyrrolidone and 40% vinyl acetate. K-value=30–50.

Polymer II: Carboset XPD1708G from B. F. Goodrich, a coplymer of 75% methymethacrylate and 25% methacrylic acid, average weight molecular weight Mw=~7,000, acid number=150.

Polymer III: Carboset XPD1234 from B. F. Goodrich, a coplymer of 80% methymethacrylate and 20% methacrylic acid, average weight molecular weight Mw=~6,000, acid number=120.

Polymer IV: The photocrosslinkable copolymer comprising methyl methacrylate 75% by weight with methacrylic acid 16% and 9% methacrylic ester that was formed from the reaction with glycidyl methacrylate and methyl acrylic acid. It had a transition temperature of 102° C. and an average molecular weight ~6,500. The polymer chemical structure is as follows:

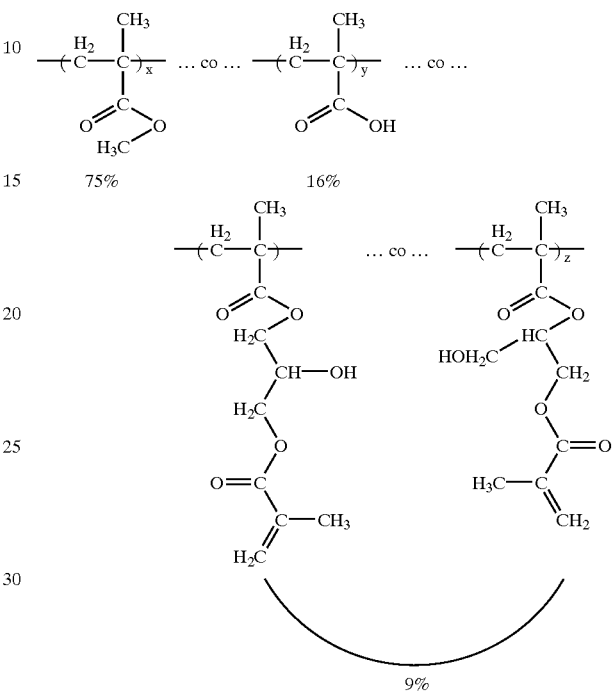

III. Monomer

Monomer: TMPEOTA—Trimethylolpropane ethoxy triacrylate from Sartomer.

IV. Medium compositions

| | Medium Number | | | |
|---|---|---|---|---|
| Component | I | II | III | IV |
| Solvent: Texanol | 55.34 | 46.87 | 54.44 | 65.4 |
| Polymer I | 1.53 | 1.48 | 1.51 | 1.53 |
| Polymer II | | 34.95 | | |
| Polymer III | 36.20 | | 35.6 | |
| Polymer IV | | | | 36.14 |
| 1,4,4-Trimethyl-2, 3-diazabicyclo[3,2,2]-non-2-2n2-N, N'-dioxide | 0.07 | 0.06 | 0.07 | 0.07 |
| Benzildimethyl-ketal | 2.56 | 2.56 | 2.51 | |
| Isopropylthioxanthone | 2.15 | 8.32 | 2.11 | 2.15 |
| Ethyl 4-dimethylamino benzoate | 2.15 | 8.32 | 2.11 | 2.15 |
| Stearic acid/Palmitic acid 50/50 by weight | | | 1.63 | |

What is claimed is:

1. A photoimageable composition comprising:
  (I) finely divided particles of inorganic materials comprising:
    (a) functional phase particles selected from electrically conductive, resistive and dielectric particles;
    (b) inorganic binder having a glass transition temperature in the range of 325 to 600° C. a surface area to weight ratio of no greater than 10 m²/g and at least 85 wt. % of the particles having a size in the range of 0.1–10 μm; dispersed in:

(II) organic medium comprising:

(c) aqueous developable photocrosslinkable polymer which is the copolymer, interpolymer or mixture thereof, wherein each copolymer or interpolymer comprises (1) nonacidic comonomers comprising $C_{1-10}$ alkyl methacrylate, $C_{1-10}$ alkyl acrylates, styrene, substituted styrenes, or combinations thereof and (2) an acidic comonomer comprising ethylenically unsaturated carboxylic acid containing moiety, wherein 2–20% of the carboxylic acid containing moiety is reacted with a reactive molecule having a first and second functional unit wherein the first functional unit is a vinyl group and the second functional unit is capable of forming a chemical bond by reaction with the carboxylic acid moiety forming the copolymer, interpolymer or mixture having an acid content of at least 10 wt. % of the total polymer weight; and having a glass transition temperature in the range of 50–150° C. and a weight average molecular weight in the range of 2,000–250,000;

(d) photoinitiation system; and (e) photospeed enhancer wherein the enhancer comprises a ratio in the range of 30/70 to 70/30 mixture selected from stearic acid and palmitic acid; salt of stearate and salt of palmitate; stearic acid and salt of palmitate; salt of stearate and palmitic acid; and (f) organic solvent.

2. The composition of claim 1 wherein the photospeed enhancer is within the range of 0.1–1 wt % based on the functional phase particles.

3. The composition of claim 1 wherein the reactive molecule contains an epoxide group or an hydroxy group.

4. The composition of claim 1 further comprising photohardenable monomer.

5. The composition of claim 1 which is of paste consistency suitable for screen printing.

6. A sheet comprising a cast layer of a composition of claim 1 wherein the composition has been dried to remove volatile solvent.

7. An article comprising a cast layer of the composition of claim 1 wherein the composition has been heated to substantially remove the organic medium and substantially sinter the inorganic materials.

8. A photoimageable composition comprising:

(I) finely divided particles of inorganic materials comprising:

(a) functional phase particles selected from electrically conductive, resistive and dielectric particles;

(b) inorganic binder having a glass transition temperature in the range of 325 to 600° C. a surface area to weight ratio of no greater than 10 m²/g and at least 85 wt. % of the particles having a size in the range of 0.1–10 micrometers; dispersed in (II) organic medium comprising (c) a organic polymeric binder which is a copolymer, interpolymer or mixture thereof, wherein each copolymer or interpolymer comprises (1) nonacidic comonomers comprising $C_{1-10}$ alkyl methacrylate, $C_{1-10}$ alkyl acrylates, styrene, substituted styrenes, or combinations thereof, and (2) an acidic comonomer comprising ethylenically unsaturated carboxylic acid containing moiety, the copolymer, interpolymer or mixture having an acid content of at least 10 wt. % of the total polymer weight; and having a glass transition temperature in the range of 50–150° C. and a weight average molecular weight in the range of 2,000–250,000;

(d) photohardenable monomer;

(e) photoinitiation system;

(f) photospeed enhancer wherein the enhancer comprises a ratio in the range of 30/70 to 70/30 mixture selected from stearic acid and palmitic acid; salt of stearate and salt of palmitate; stearic acid and salt of palmitate; salt of stearate and palmitic acid, and (g) organic solvent.

9. The composition of claim 8 wherein the photospeed enhancer is found in the composition within the range of 0.1–1 wt % based on the functional phase particles.

10. The composition of claim 8 which is of paste consistency suitable for screen printing.

11. A sheet comprising a cast layer of a composition of claim 8 wherein the composition has been dried to remove volatile solvent.

12. An article comprising a cast layer of the composition of claim 8 wherein the composition has been heated to substantially remove the organic medium and substantially sinter the inorganic materials.

* * * * *